United States Patent
Mishra et al.

(10) Patent No.: US 11,398,853 B2
(45) Date of Patent: Jul. 26, 2022

(54) TRANSFORMER-BASED ANTENNA SWITCHING NETWORK

(71) Applicant: QUALCOMM Incorporated, San Diego, CA (US)

(72) Inventors: Chinmaya Mishra, San Diego, CA (US); Marco Vigilante, San Diego, CA (US); Chirag Dipak Patel, San Diego, CA (US); Bhushan Shanti Asuri, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 364 days.

(21) Appl. No.: 16/595,987

(22) Filed: Oct. 8, 2019

(65) Prior Publication Data
US 2021/0105047 A1   Apr. 8, 2021

(51) Int. Cl.
| | |
|---|---|
| *H04L 27/22* | (2006.01) |
| *H04B 7/0452* | (2017.01) |
| *H03F 3/217* | (2006.01) |
| *H03F 3/45* | (2006.01) |
| *H04B 1/44* | (2006.01) |

(52) U.S. Cl.
CPC ......... *H04B 7/0452* (2013.01); *H03F 3/2178* (2013.01); *H03F 3/45179* (2013.01); *H04B 1/44* (2013.01); *H03F 2200/541* (2013.01)

(58) Field of Classification Search
CPC ... H04L 27/22; H04L 27/2332; H04L 5/1461; H04B 7/02; H01Q 1/50; H03F 2200/537; H03F 2200/541

USPC .............................................. 375/329; 455/75
See application file for complete search history.

(56) References Cited

U.S. PATENT DOCUMENTS

| | | | |
|---|---|---|---|
| 2005/0090287 A1* | 4/2005 | Rofougaran | H04B 1/18 455/562.1 |
| 2011/0281531 A1* | 11/2011 | Chiang | H04B 1/0458 455/75 |
| 2015/0094117 A1 | 4/2015 | Conta et al. | |
| 2017/0041995 A1* | 2/2017 | Jin | H05B 45/382 |
| 2017/0093032 A1* | 3/2017 | Khoury | H04B 7/02 |
| 2018/0041244 A1 | 2/2018 | Ding et al. | |
| 2019/0123438 A1* | 4/2019 | Mizunuma | H01Q 21/062 |
| 2021/0036626 A1* | 2/2021 | Balda Belzunegui | H02M 7/797 |

OTHER PUBLICATIONS

An et al., "Power-Combining Transformer Techniques for Fully-Integrated CMOS Power Amplifers," IEEE Journal of Solid-State Circuits, vol. 43, No. 5, May 2008, pp. 1064-1075, https://ieeexplore.ieee.org/document/4494643/.

(Continued)

*Primary Examiner* — Khai Tran
(74) *Attorney, Agent, or Firm* — Hayes and Boone, LLP

(57) ABSTRACT

A transformer-based antenna switching network includes a transformer having a secondary winding that extends between a first terminal and a second terminal. The first terminal couples to ground through a first switch and connects to a first antenna. The second terminal couples to ground through a second switch and connects to a second antenna.

35 Claims, 10 Drawing Sheets

(56) References Cited

OTHER PUBLICATIONS

Adabi E., et al., "A mm-Wave Transformer Based Transmit/Receive Switch in 90nm CMOS Technology," 2009 European Microwave Conference (EuMC), Rome, 2009, pp. 389-392, Retrieved from the Internet, URL: http://eeexplore.ieee.org/stamp/stamp.jsp?tp=&amumber=5295932&isnumber=5295900.
International Search Report and Written Opinion—PCT/US2020/051971—ISA/EPO—Dec. 10, 2020.

* cited by examiner

TRANSFORMER-BASED ANTENNA SWITCHING NETWORK

TECHNICAL FIELD

This application relates to transceivers, and more particularly to a transformer-based antenna switching network for selectively coupling transceivers and antennas.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

In accordance with a first aspect of the disclosure, a transformer-based antenna switching network is disclosed that includes: a first transformer having a secondary winding, a first switch coupled between a first terminal for the secondary winding of the first transformer and ground; a first antenna coupled to the first terminal; a second switch coupled between a second terminal of the secondary winding of the first transformer and ground; and a second antenna coupled to the second terminal.

In accordance with a second aspect of the disclosure, an antenna switching method is disclosed that includes: opening a first switch coupled between a first terminal of a secondary winding of a first transformer and ground; and closing a second switch coupled between a second terminal of the secondary winding of the first transformer and ground to select for a first antenna connected to the first terminal and to isolate a second antenna connected to the second terminal.

In accordance with a third aspect of the disclosure, a transformer-based antenna switching network is disclosed that includes: a first transformer having a first secondary winding; a second transformer having a second secondary winding, wherein the second secondary winding includes a first terminal connected to a first terminal of the first secondary winding; a third transformer having a third secondary winding; a fourth transformer having a fourth secondary winding, wherein the fourth secondary winding includes a first terminal connected to a first terminal of the third secondary winding; a first antenna connected to a second terminal of the first secondary winding; a first switch coupled between ground and the second terminal of the first secondary winding; a second switch coupled between ground and a second terminal of the second secondary winding; a third switch coupled between ground and a second terminal of the third secondary winding; a fourth switch coupled between ground and a second terminal of the fourth secondary winding; and a second antenna connected to the second terminal of the fourth secondary winding.

In accordance with a fourth aspect of the disclosure, a transformer-based antenna switching network is provided that includes: a transformer including a secondary winding and a primary winding; a first switch coupled between a first terminal of the secondary winding of the transformer and ground; a second switch coupled between a second terminal of the secondary winding of the transformer and ground; and a differential power amplifier having a first output connected to a first terminal of the primary winding for the transformer and having a second output connected to a second terminal of the primary winding of the transformer.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
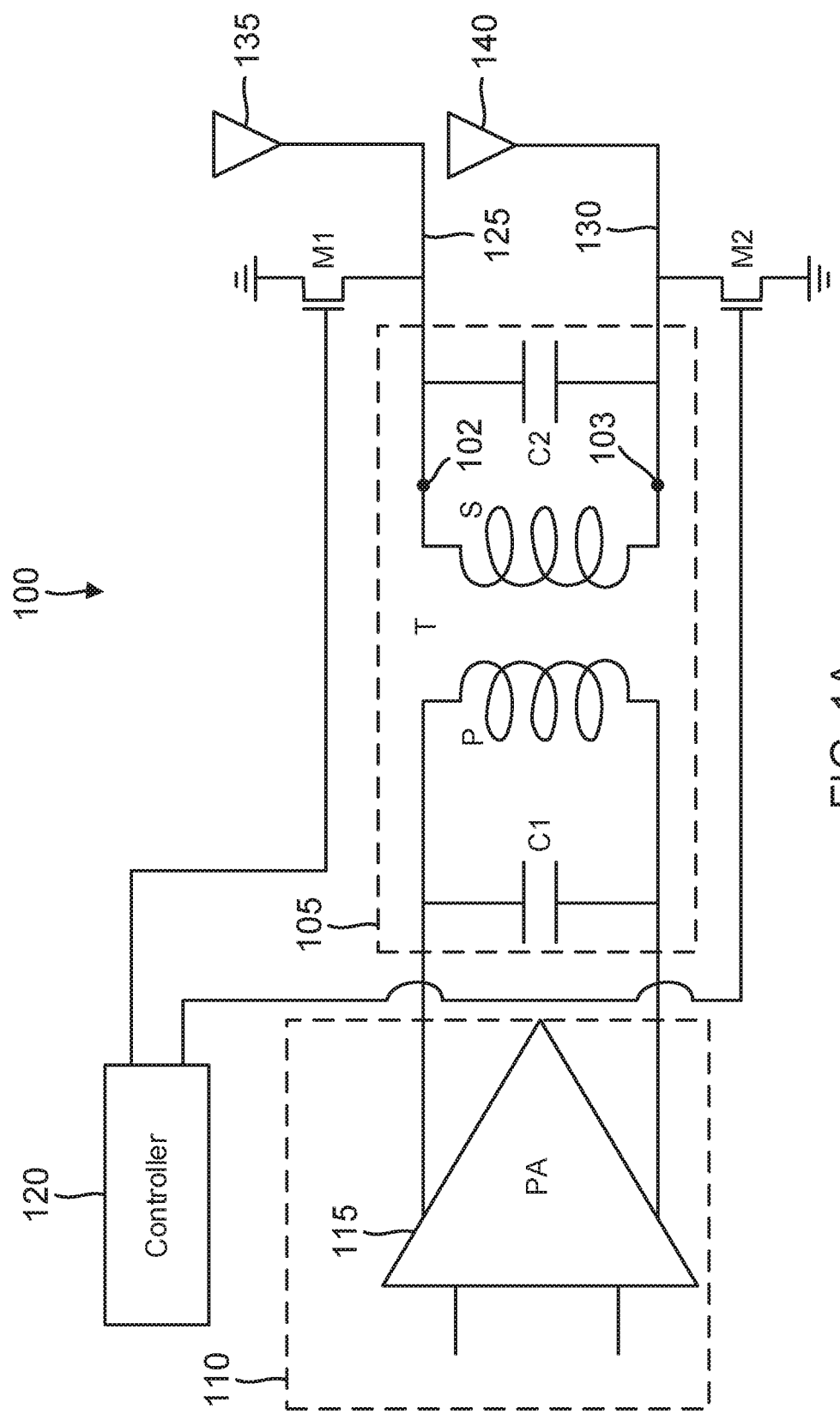
FIG. 1A illustrates a transformer-based antenna switching network including two parallel switch transistors for switching between two antennas in accordance with an aspect of the disclosure.

To support the high data rates for modern cellular communication protocols such as the fifth generation (5G) cellular network technology, the transmission wavelength is being expanded to the millimeter wave spectrum. Due to the smaller wavelength size at these higher frequencies, a mobile device may incorporate an array of antennas despite the mobile device having a relatively small form factor. By utilizing different types of antennas within the array, the mobile device may change its beam width and other transmission parameters depending upon the radio frequency (RF) environment.

To drive the different antennas within an array, a mobile device may include separate transmitters that drive specific antennas through dedicated transmitter paths. But the use of separate transmitters increases costs due to the increased semiconductor die space needed to form the various transmitters. To lower costs, a shared transmitter may be used to select between two or more antennas through an antenna switching network having switches in series with the shared transmitter and corresponding ones of the antennas. For example, by closing a first switch transistor in series between the shared transmitter and a first antenna while opening a second switch transistor in series between the shared transmitter and a second antenna, a shared transmitter may drive the first antenna while isolating the second antenna. If the first switch transistor is then opened while the second switch transistor is closed, the shared transmitter may then drive the second antenna while isolating the first antenna.

Although such a shared transmitter architecture is feasible at lower frequencies, note that a switch transistor will have a certain amount of off-capacitance (Coff) when switched off. At the millimeter wave frequencies used such as for 5G, significant amount of leakage power will thus leak through the off-capacitance in the switched-off switch transistor for a shared transmitter. Power is then undesirably lost as radiation from the unselected antenna that should otherwise be isolated.

To provide an improved antenna switching network with reduced leakage power losses, a transformer-based antenna switching network is disclosed for a shared transmitter to select between a plurality of antennas. The transformer-based antenna switching network includes an antenna switching network formed by a transformer that includes a primary winding driven by the shared transmitter. The following discussion will be directed to differential shared transmitter embodiments, but it will be appreciated that a single-ended shared transmitter may be implemented in alternative embodiments. One output port for the shared transmitter drives a first terminal for the primary winding whereas a remaining second output port for the shared transmitter drives a second terminal for the primary winding.

Depending upon the desired transmission characteristics, a controller controls a pair of switch transistors coupled to a secondary winding of the transformer in the antenna switching network to select between the antennas. In particular, a first one of the switch transistors couples between ground and a first terminal for the secondary winding. Similarly, a second one of the switch transistors couples between ground and a second terminal for the secondary winding. The secondary winding extends between the first terminal and the second terminal. The secondary winding's first terminal couples through a first transmission line to a first one of the antennas. Similarly, the secondary winding's second terminal couples through a second transmission line to a second one of the antennas. As used herein, a "transmission line" refers to any suitable form of transmission line such as a microstrip line, a coplanar waveguide, a slotline, or a stripline. In addition, as used herein, the term couples" or "coupled" refers to an electrical connection that may be direct (no intervening elements) or may be indirect such as coupled through an intervening element such a filter.

To select for the first antenna while isolating the second antenna, the controller switches off the first switch transistor and switches on the second switch transistor. In such a configuration, the second terminal for the secondary winding is thus the ground terminal whereas the secondary winding's first terminal is a single-ended drive terminal for the first antenna. It will thus be appreciated that the transformer-based antenna switching network is then functioning as a balun that allows the differential transmitter to single-endedly drive the first antenna. In addition, the transformer-based antenna network matches an output impedance for the shared transmitter to an input impedance for the first transmission line (this input impedance also being matched to an input impedance for the first antenna).

To select for the second antenna while isolating the first antenna, the controller switches on the first switch transistor and switches off the second switch transistor. In this configuration, it is the first terminal for the secondary winding that becomes the ground terminal whereas the second terminal for the secondary winding becomes a single-ended drive terminal for the second antenna. While selecting for the second antenna, the transformer-based antenna switching network again functions as a balun and also matches the output impedance of the shared transmitter to the impedance of the second transmission line (which in turn matches the input impedance of the second antenna). Regardless of which antenna is selected, note that the power leakage to the isolated antenna is inversely proportional to the on-resistance for the switched-on switch transistor. The power leakage for the resulting transformer-based antenna switching network is thus reduced as compared to a serial-switch antenna switching topology.

An example transformer-based antenna switching network 100 is shown in FIG. 1A that includes an antenna switching network 105 formed by a transformer T having a primary winding P and a secondary winding S. A shared transmitter 110 drives both a first terminal and a second terminal for primary winding P. Those of ordinary skill in the RF arts will appreciate that shared transmitter 110 includes an RF frontend that would extend from a baseband section through an optional intermediate frequency (IF) section to an RF section that ends in a differential power amplifier (PA) 115. For illustration clarity, power amplifier 115 is the only component shown in shared transmitter 110. Other components of the RF frontend such as filters (not illustrated) may be dedicated to a particular RF path or shared.

A secondary winding S for transformer T includes a first terminal 102 connected to a first antenna 135 through a first transmission line 125. In addition, the secondary winding includes a second terminal 103 connected to a second antenna 140 through a second transmission line 130. To better match an output impedance of PA 115 to an input impedance for first antenna 135 and second antenna 140, a capacitor C1 is arranged in parallel with primary winding P. Similarly, a capacitor C2 is arranged in parallel with secondary winding S to further aid in the impedance matching. To select between first antenna 135 and second antenna 140 for transmitting a radio frequency (RF) signal as amplified by power amplifier 115, a controller 120 controls a first switch such as a first switch transistor M1 and controls a second switch such as a second switch transistor M2. Controller 120 is a logic circuit that may be implemented by a processor, a field programmable gate array, a state machine, or other suitable types of logic circuits. First switch transistor M1 is coupled between first terminal 102 of the secondary winding and ground. Similarly, second switch transistor M2 is coupled between second terminal 103 of the secondary winding and ground. Both switch transistors may be n-type metal-oxide semiconductor (NMOS) field-effect transistors but it will be appreciated that other suitable transistors may be used such as p-type metal-oxide semiconductor (PMOS) or bipolar junction transistors other types of electronic switching devices. In some embodiments, antenna 135 and antenna 140 are part of a phased-array of antennas.

Figure 1B:
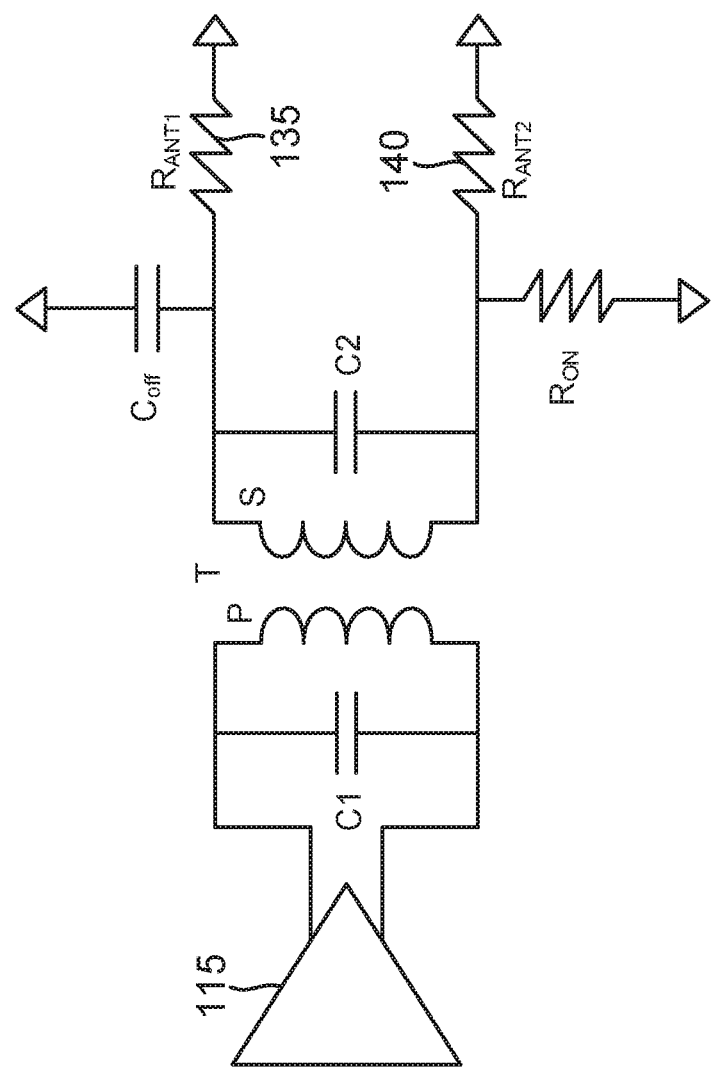
FIG. 1B illustrates the off-capacitance for a first one of the parallel switch transistors and the on-resistance for a second one of the parallel switch transistors in the transformer-based antenna switching network of FIG. 1A.

To transmit an RF signal through antenna 135, controller 120 switches off switch transistor M1 and switches on switch transistor M2. Conversely, controller 120 switches on switch transistor M1 and switches off switch transistor M2 to transmit an RF signal through antenna 140. Regardless of which antenna is selected, the switched-off transistor presents an off-capacitance ($C_{off}$) to the secondary winding terminal that connects to the selected antenna. The switched-on transistor presents an on-resistance (Ron) between ground and the secondary winding terminal that connects to the non-selected antenna. For example, the off-capacitance for switch transistor M1 and the on-resistance for switch transistor M2 are shown in FIG. 1B for network 100 in which switch transistor M1 is off and switch transistor M2 is on. Antenna 135 is represented by its resistance $R_{ANT1}$. Similarly, antenna 140 is represented by its resistance $R_{ANT2}$. Since antenna 140 is not selected, the power it receives is a power leakage as compared to the much larger transmission power in the RF signal driving selected antenna 135. But this power leakage is inversely proportional to the on-resistance Ron for switch transistor M2 since the resistance $R_{ANT2}$ is in parallel with respect to ground with the on-resistance Ron. In contrast, each switch transistor in a series-switch architecture would have a first drain/source terminal connected to the secondary winding and a second drain/source terminal connected to its corresponding antenna. There is thus no direct connection to ground for such a serially-arranged switch transistor. A series-switch approach results in a power leakage that is proportional to the off-capacitance of the series switch. The power leakage for the parallel-arranged switch transistors disclosed herein is thus advantageously low as compared to the power leakage for a corresponding series-switch antenna network.

Note that the off-capacitance for the switch transistor connected to the selected antenna is in parallel with the secondary winding inductance. The off-capacitance of the switch transistor, the C2 capacitance, and the secondary winding inductance thus form a parallel LC resonant circuit, where L is the secondary winding inductance and C is a sum of the off-capacitance and the C2 capacitance. The resonant frequency of such a parallel LC resonant circuit is proportional to an inverse of a square root of the LC product. By an appropriate selection of the off-capacitance, the C2 capacitance. and the secondary winding inductance so that the parallel LC circuit is resonant for the operating bandwidth of PA 115, the off-capacitance can thus be resonated out by the secondary winding inductance (or by the primary winding inductance) of the transformer T. Since the effects of the off-capacitance can thus be eliminated or reduced, the switch transistors M1 and M2 may both be relatively large so as to reduce their on-resistance despite the increase in off-capacitance that results from the larger transistor dimensions. In alternative embodiments, the off-capacitance may be sufficient for resonance such that capacitor C2 may be eliminated.

The selection of either antenna 135 or antenna 140 for receiving an RF signal is analogous as will be explained further herein. Regardless of whether the selected antenna is transmitting or receiving, the switch transistor that is switched off connects to the same secondary winding terminal as the selected antenna whereas the remaining switch transistor is switched on.

Figure 1C:
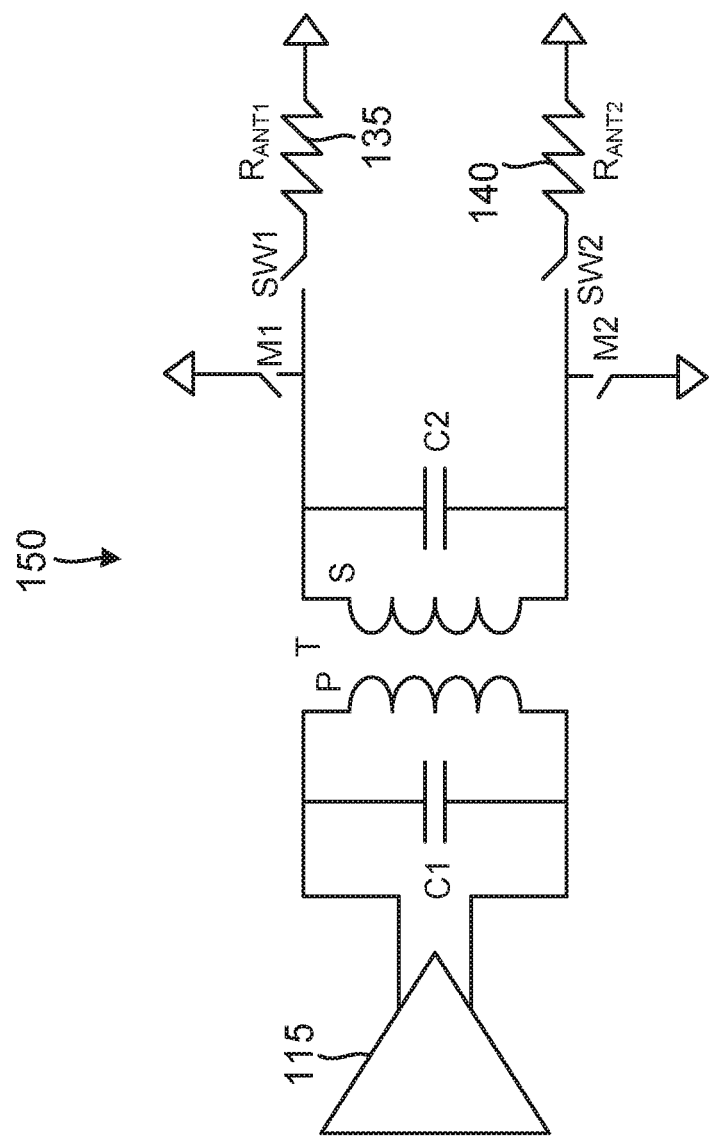
FIG. 1C illustrates a modification of the transformer-based antenna switching network of FIG. 1A with a pair of serial switch transistors in accordance with an aspect of the disclosure.

Network 100 may be modified to include serial switches to further isolate the antennas in alternative embodiments. For example, a transformer-based antenna switching network 150 shown in FIG. 1C contains the same arrangement of power amplifier 115, transformer T, capacitors C1 and C2, and switches M1 and M2 (for brevity, the terms "switch" and "switch transistor" are used interchangeably herein) as discussed for network 100. To provide further isolation, antenna 135 couples to the first terminal for the secondary winding of transformer T through a serial switch SW1. Similarly, antenna 140 couples to the second terminal for the secondary winding through a serial switch SW2. Should antenna 135 be selected by a controller (not illustrated), switches M2 and SW1 are closed and switches M1 and SW2 are opened. Conversely, should antenna 140 be selected, switches M1 and SW2 are closed and switches M2 and SW1 are opened. Although serial switches SW1 and SW2 introduce an on-resistance loss to their respective selected antenna, their inclusion increases isolation of the non-selected antenna without increasing a leakage loss.

An array of more than two antennas may be selectively driven using the transformer-based antenna switching networks disclosed herein. For example, a transformer-based antenna switching network 200 shown in FIG. 2 includes a first patch antenna 215, a dipole antenna 220, and a second patch antenna 225. A first power amplifier 205 drives a primary winding of a first transformer T1. Similarly, a second power amplifier 210 drives a primary winding of a second transformer T2. Transformers T1 and T2 are configured analogously as discussed for transformer T of network 100. In particular, a first switch S1 couples between ground and a first terminal for a secondary winding of transformer T1. This first terminal also connects to first patch antenna 215 through a corresponding transmission line. A second switch S2 couples between ground and a second terminal for the secondary winding of transformer T1 that also connects to a first terminal for a dipole antenna 220 through a corresponding transmission line. For the secondary winding of transformer T1, first switch S1 is thus the equivalent of first switch transistor M1 whereas second switch S2 is the equivalent of second switch transistor M2. Similarly, a third switch S3 couples between ground and a first terminal for the secondary winding of transformer T2. This first terminal also connects to a second terminal of dipole antenna 220 through a corresponding transmission line. Finally, a fourth switch S4 couples between ground and a second terminal of the secondary winding of transformer T2. This second terminal also connects to second patch antenna 225 through a corresponding transmission line. With respect to the secondary winding of transformer T2, third switch S3 is thus the equivalent of first switch transistor M1 whereas fourth switch S4 is the equivalent of second switch transistor M2. In transformers T1 and T2, capacitors C1 and C2 are arranged analogously as discussed for transformer T of network 100.

Switches S1, S2, S3, and S4 may each be implemented using a switch transistor as discussed for network 100. To select for simultaneous transmission through patch antennas 215 and 225, switches S1 and S4 are opened and switches S2 and S3 are closed. Power amplifier 205 may then drive first patch antenna 215 while power amplifier 210 drives second patch antenna 225. Dipole antenna 220 is isolated by the closing of switches S2 and S3. To select for transmission with dipole antenna 220, switches S2 and S3 are opened and switches S4 and S1 closed. Power amplifiers 205 and 210 would then drive dipole antenna 220 differentially but it will be appreciated that a dipole antenna may be driven in a single-ended fashion in alternative antenna switching network embodiments. A controller analogous to controller 120 for controlling the switching of switches S1, S2, S3, and S4 is not shown in FIG. 2 for illustration clarity. In alternative embodiments, dipole antenna 220 may be replaced by two separate antennas. For example, the second terminal of the secondary winding for transformer T1 may connect to a third patch antenna (not illustrated). Similarly, the first terminal of the secondary winding for transformer T2 may connect to a fourth patch antenna (not illustrated).

As compared to patch antennas 215 and 225, dipole antenna 220 has an omnidirectional beam pattern. In contrast, the beam pattern from patch antennas 215 and 225 is much more directional. A controller (not illustrated) for antenna switching network 200 may thus select for patch antennas 215 and 225 when the radiated RF power should be concentrated in a particular direction whereas dipole antenna 220 is selected by controller 120 during omnidirectional modes of transmission.

Figure 2:
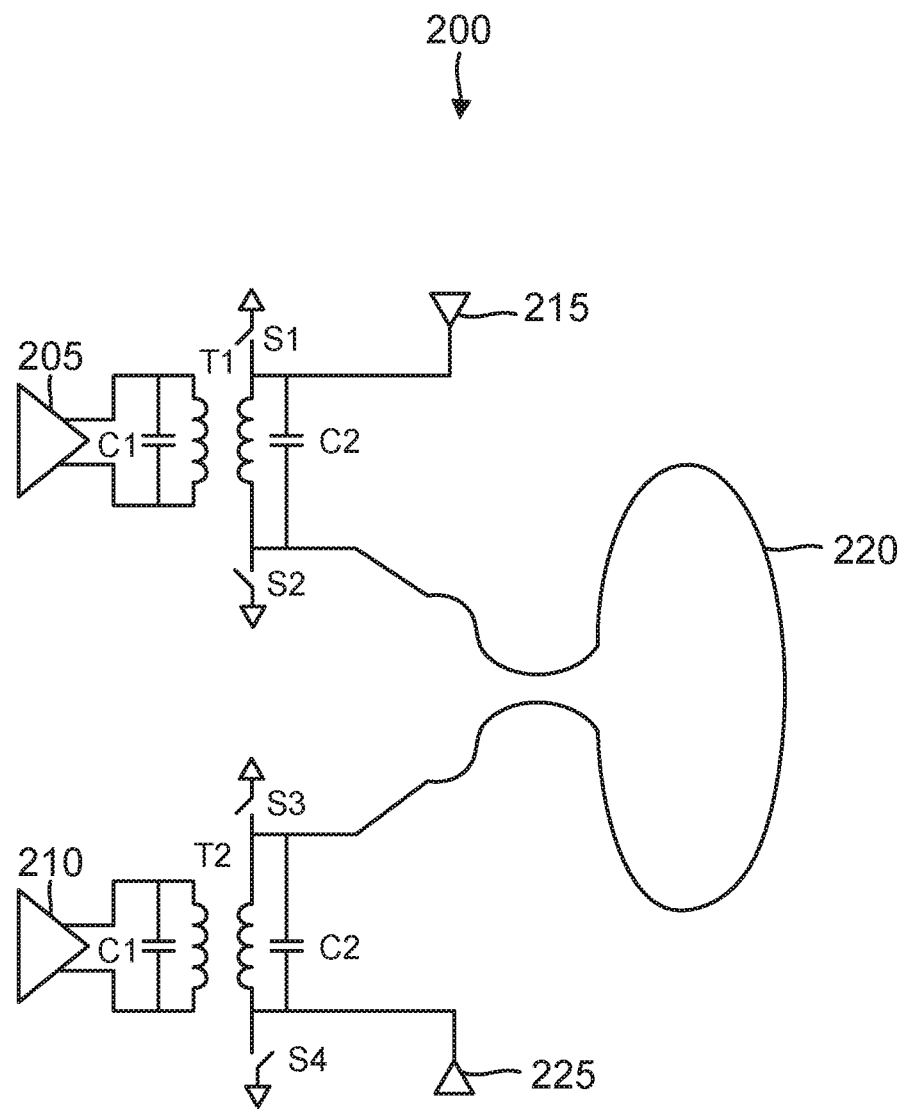
FIG. 2 illustrates a transformer-based antenna network including two transformers and four parallel switches for switching between three antennas in accordance with an aspect of the disclosure.
Figure 3:
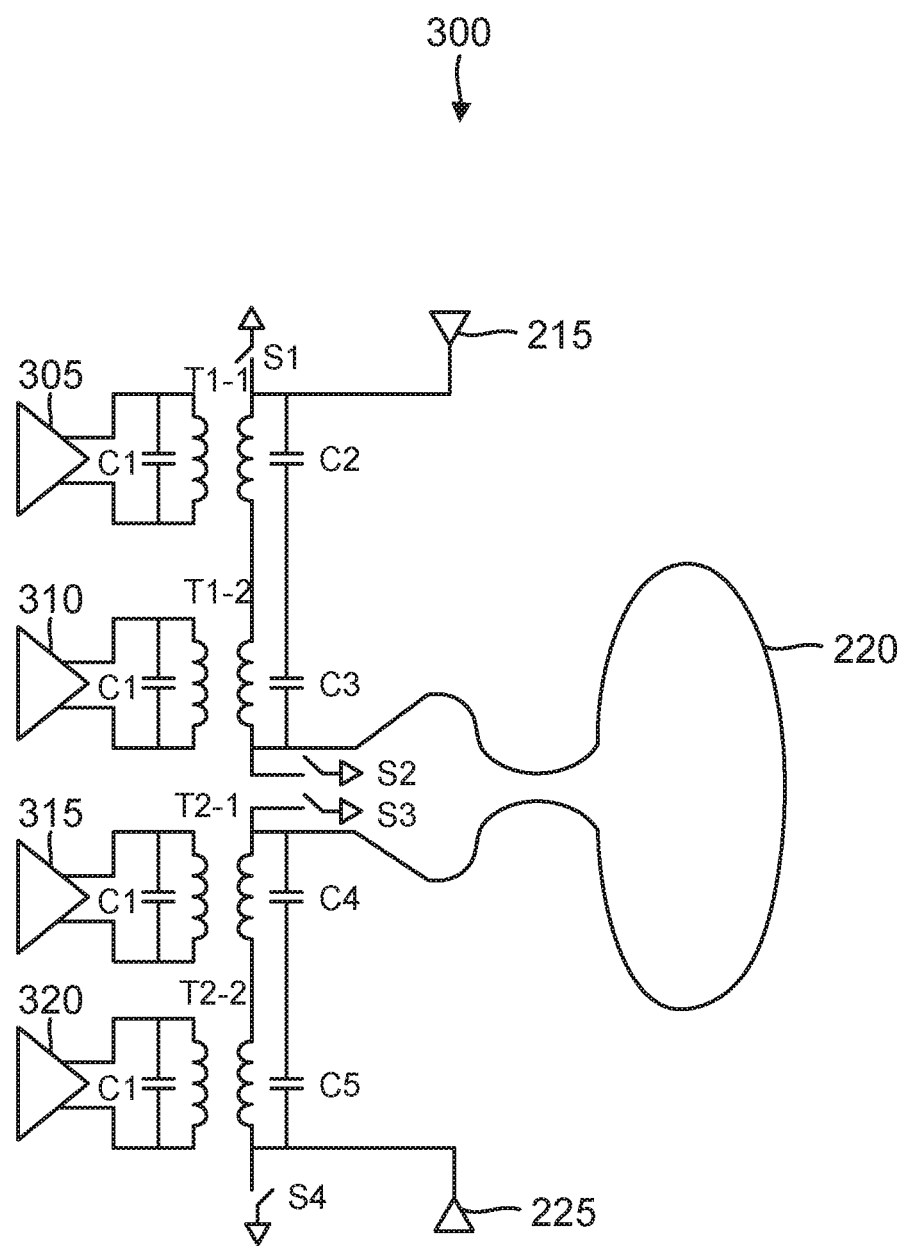
FIG. 3 illustrates a modification of the transformer-based switching network of FIG. 2 to include two additional power amplifiers in accordance with an aspect of the disclosure.

The antenna array of FIG. 2 may be driven with four power amplifiers instead of two as shown for a transformer-based switching network 300 of FIG. 3. Transformer T1 of network 200 is bifurcated in network 300 into a transformer T1-1 and a transformer T1-2. A first power amplifier 305 is configured to drive a primary winding of transformer T1-1. Similarly, a second power amplifier 310 is configured to drive a primary winding of transformer T1-2. A first terminal for the secondary winding of transformer T1-1 connects to first patch antenna 215 and couples to ground through switch S1. A second terminal of the secondary winding for transformer T1-1 connects to a first terminal of the secondary winding for transformer T1-2. A second terminal of the secondary winding for transformer T1-2 connects to a first terminal (input) for dipole antenna 220 and couples to ground through switch S2. The secondary windings for transformers T1-1 and T1-2 are thus arranged in series. A capacitor C2 connects in series from the first terminal of the secondary winding for transformer T1-1 with a capacitor C3 that connects to the second terminal of the secondary winding for transformer T1-2.

The action of switches S1 and S2 with regard to selecting for patch antenna 215 or dipole antenna 220 is as discussed with regard to network 200. The power from each power amplifier 305 and 310 is thus added to drive the selected antenna due to the serial connection of the secondary windings for the transformers T1-1 and T1-2. In contrast, the power would be reduced by one-half in a serial switch architecture because power amplifier 305 would only drive first patch antenna 215 in that case. Similarly, power amplifier 310 would only drive dipole antenna 220 in a serial switch architecture. Network 300 thus provides twice the output power as would be obtained from a serial switch architecture with the same number of power amplifiers.

The bifurcation of transformer T2 of network 200 into a transformer T2-1 and a transformer T2-1 in network 300 is analogous. A third power amplifier 315 is configured to drive a primary winding of transformer T2-1. Similarly, a fourth power amplifier 320 is configured to drive a primary winding of transformer T2-2. A first terminal of the secondary winding of transformer T2-1 connects to a second terminal of dipole antenna 220 and couples to ground through switch S3. A second terminal of the secondary winding of transformer T2-1 connects to a first terminal of the secondary winding for transformer T2-2. A second terminal of the secondary winding for transformer T2-2 connects to second patch antenna 225 and couples to ground through switch S4. The secondary windings for transformers T2-1 and T2-2 are thus arranged in series. A capacitor C4 connects in series from the first terminal of the secondary winding for transformer T2-1 with a capacitor C5 that connects to the second terminal of the secondary winding for transformer T2-2. The action of switches S3 and S4 with regard to selecting for second patch antenna 225 or dipole antenna 220 is as discussed with regard to network 200. The power from power amplifier 315 and power amplifier 320 is thus added to drive the selected antenna due to the serial connection of the secondary windings for the transformers T2-1 and T2-2. A controller analogous to controller 120 for controlling the switching of switches S1, S2, S3, and S4 is not shown in FIG. 2 for illustration clarity.

In network 300, the secondary winding for transformer T1-1 may be denoted as a first secondary winding. Similarly, the secondary winding for transformer T1-2 may be denoted as a second secondary winding whereas the secondary winding for transformer T2-1 may be denoted as a third secondary winding. Finally, the secondary winding for transformer T2-2 may be denoted as a fourth secondary winding. Similarly, transformers T1-1, T1-2, T2-1, and T2-2 may be deemed to be first, second, third, and fourth transformers respectively. Finally, power amplifiers 305, 310, 315, and 320 may be deemed to be first, second, third, and fourth power amplifiers, respectively.

Figure 4:
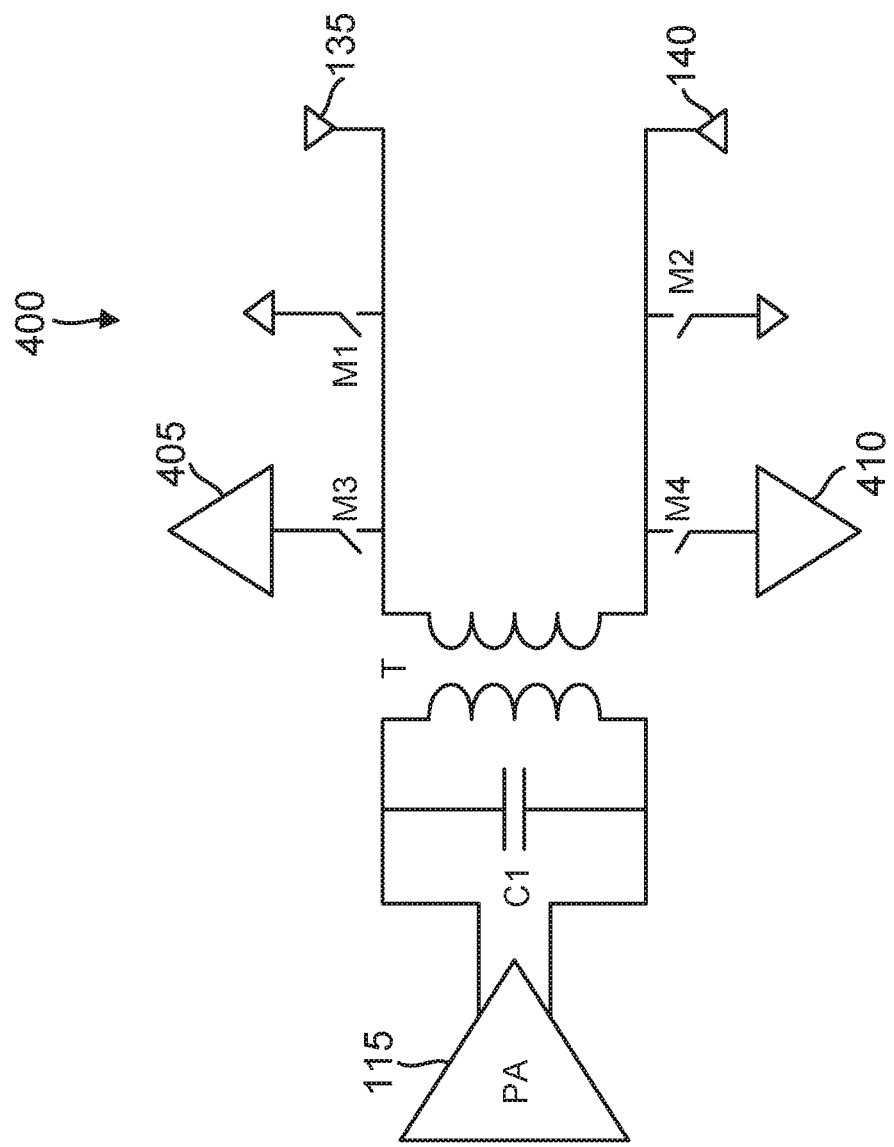
FIG. 4 illustrates a modification of the transformer-based switching network of FIG. 1 to include a receive path with two single-ended low-noise amplifiers.

The receive path for a transceiver coupled to a transformer-based antenna switching network as disclosed herein may depend upon whether the low-noise amplifier(s) in the receive path are single-ended or differential. For example, a transformer-based switching network 400 shown in FIG. 4 couples to a pair of single-ended LNAs 405 and 410. Network 400 is analogous to network 100 in that it includes power amplifier 115, capacitor C1, transformer T, switches M1 and M2, and also antennas 135 and 140. As with the other transformer-based switching networks disclosed herein, note that the off-capacitance of switches M1 and M2 may be used to obviate a need for an analog to capacitor C2 of network 100. Alternatively, the off-capacitances of switches M1 and M2 may be used for other purposes such as filtering. LNA 405 couples to the secondary winding terminal for antenna 135 through a switch M3. Similarly, LNA 410 couples to the secondary winding terminal for antenna 140 through a switch M4. Switches M3 and M4 are controlled in opposition with corresponding switches M1 and M2. For example, a controller (not illustrated) opens switch M1 and closes switch M2 to select for antenna 135 to provide a received RF signal to LNA 40 and to isolate antenna 140. Switch M3 is thus closed when corresponding switch M1 is opened and switch M4 is opened when corresponding switch M2 is closed so that LNA 405 may amplify the received RF signal from antenna 135. Should antenna 140 be selected, switch M2 is opened and switch M1 closed. Switch M4 is thus closed when corresponding switch M2 is opened and switch M3 opened when corresponding switch M1 is closed so that LNA 410 may amplify a received RF signal from antenna 140. The transmit path from power amplifier 115 to the selected one of antennas 135 and 140 is as discussed for network 100.

Figure 5:
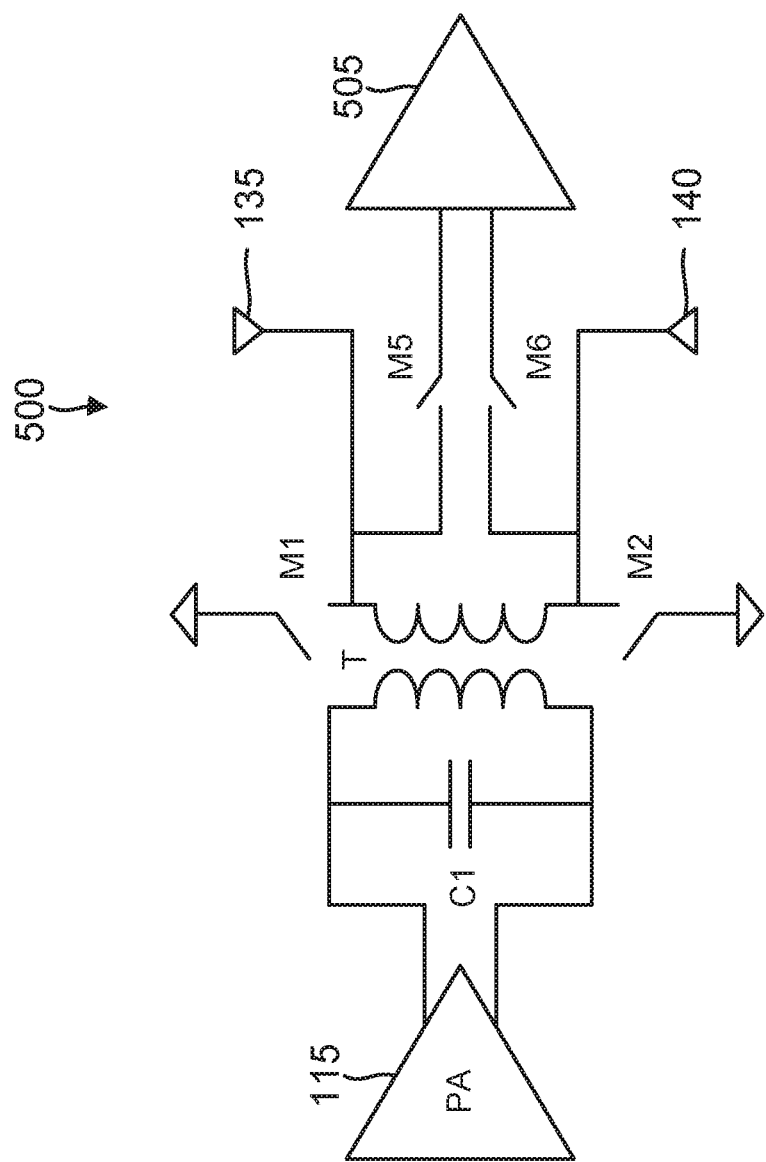
FIG. 5 illustrates a modification of the transformer-based switching network of FIG. 1 to include a receive path with a differential low-noise amplifier.

A receive path including a differential LNA 505 is shown in FIG. 5 for a transformer-based switching network 500. Network 500 is analogous to network 400 in that network 500 includes power amplifier 115, capacitor C1, transformer T, switches M1 and M2, and also antennas 135 and 140. LNA 505 includes a first input terminal that couples to the secondary winding terminal for antenna 135 through a switch M5. Similarly, LNA 505 includes a second input terminal that couples to the secondary winding terminal for antenna 140 through a switch M6. Switches M5 and M6 are controlled to close during a receive mode and to open in a transmit mode. For example, a controller (not illustrated) opens switch M1 and closes switch M2 to select for antenna 135 and isolate antenna 140. In a receive mode, switches M5 and M6 would then be closed. Should antenna 140 be selected during a receive mode, switch M2 is opened and switch M1 closed while switches M5 and M6 are closed. The transmit path from power amplifier 115 to the selected one of antennas 135 and 140 is as discussed for network 100.

Figure 6:
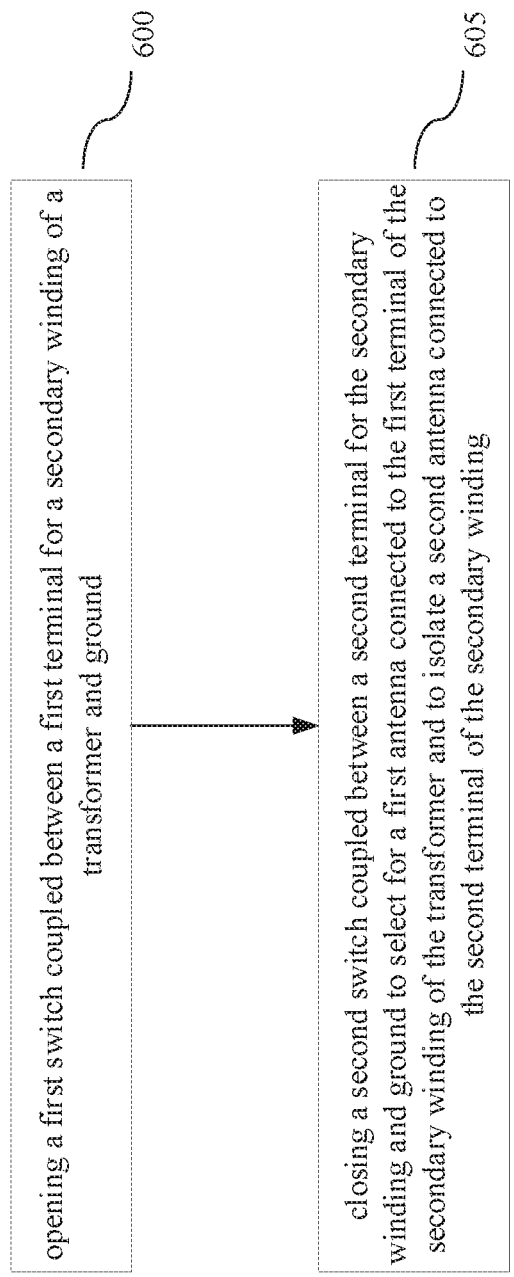
FIG. 6 is a flowchart for a method of selecting a first antenna from a pair of antennas using a transformer-based switching network in accordance with an aspect of the disclosure.

A flowchart for a method of operation for a transformer-based antenna switching network is shown in FIG. 6. The method includes an act 600 of opening a first switch coupled between a first terminal for a secondary winding of a transformer and ground. The opening of switch M1 in network 100 is an example of act 600. The method also includes an act 605 of closing a second switch coupled between a second terminal for the secondary winding and ground to select for a first antenna connected to the first terminal and to isolate a second antenna connected to the second terminal. The closing of switch M2 while switch M1 is open to select for antenna 135 and to isolate antenna 140 in network 100 is an example of act 605.

Figure 7:
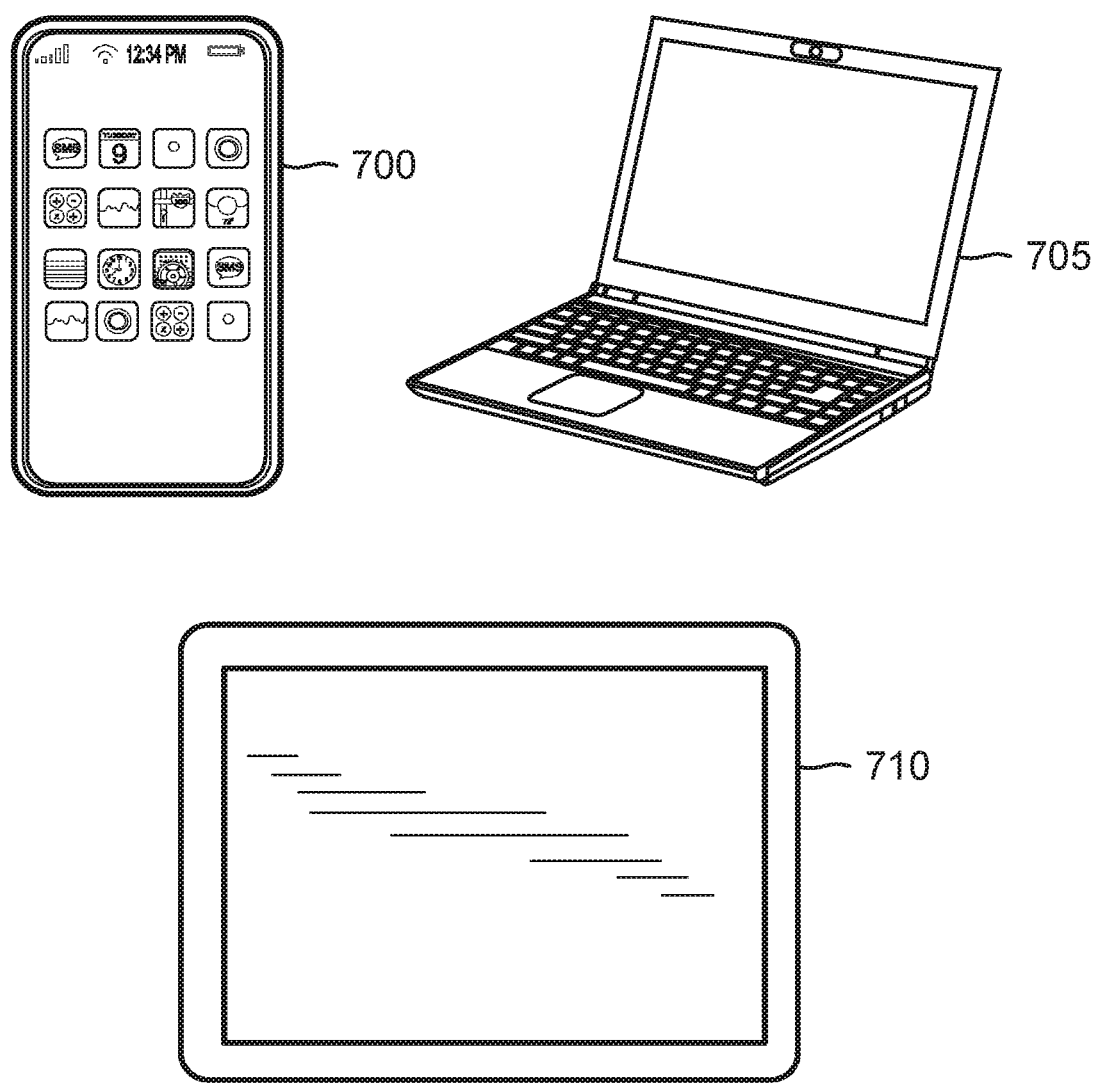
FIG. 7 illustrates some example electronic systems each including a transformer-based switching network in accordance with an aspect of the disclosure.

A transformer-based antenna switching network as disclosed herein may be incorporated into a wide variety of electronic systems. For example, as shown in FIG. 7, a cellular device such as cellular telephone 700, a laptop computer 705, and a tablet PC 710 may all include a transformer-based antenna switching network in accordance with the disclosure. Other exemplary electronic systems such as a music player, a video player, a communication device, and a personal computer may also be configured with transformer-based antenna switching networks constructed in accordance with the disclosure.

Figure 8:
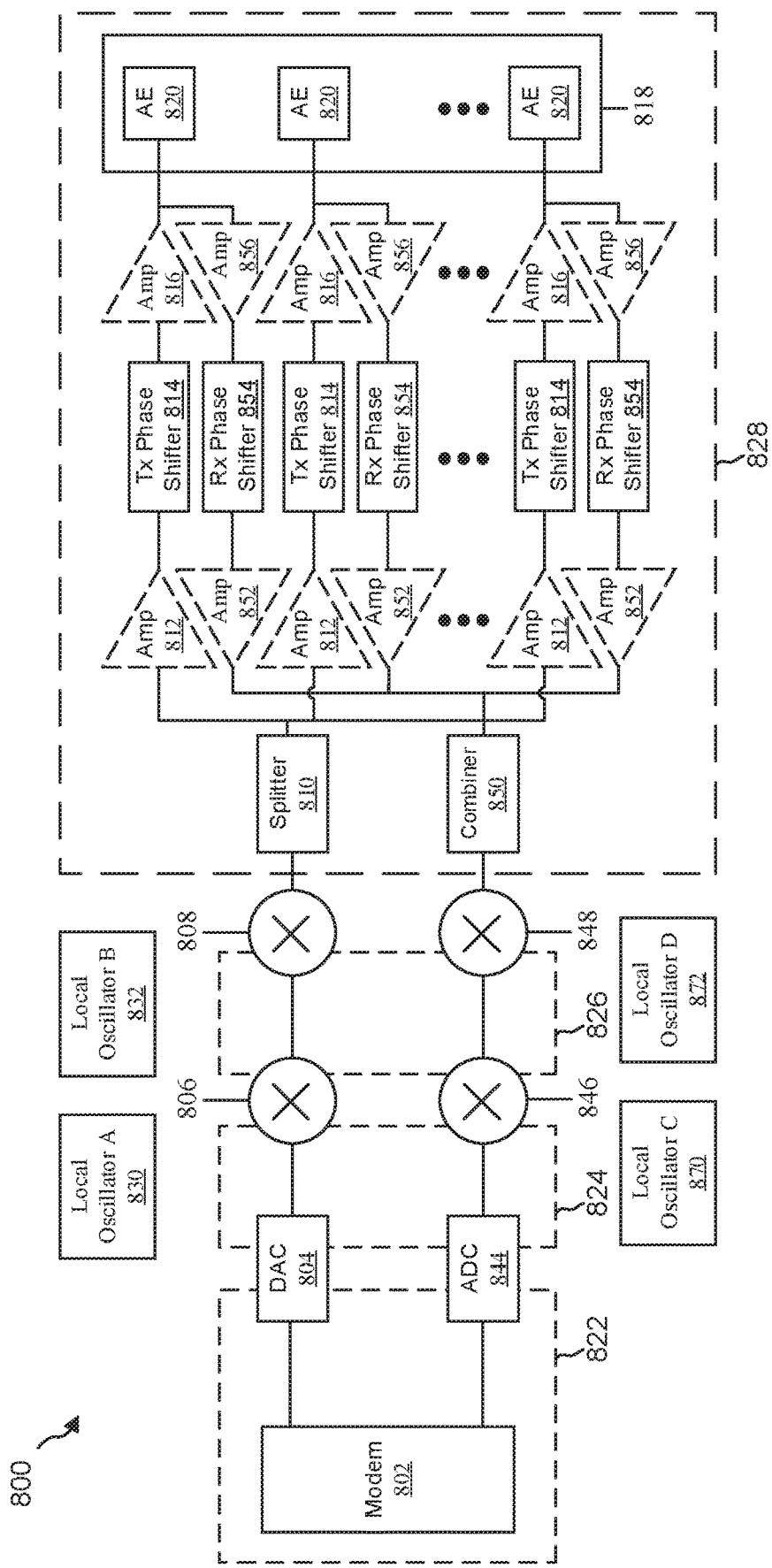
FIG. 8 illustrates a beamforming transceiver including an antenna array and a corresponding antenna switching network in accordance with an aspect of the disclosure.

A transformer-based antenna switching networks as disclosed herein may also be advantageously combined with beam-forming as noted earlier. An example beam-forming RF architecture 800 is shown in FIG. 8 that selectively drives an array of antennas 820 through an antenna switching network 818 as disclosed herein. In some examples, architecture 800 may implement aspects of wireless communication systems such as a first wireless device, UE, or base station) and/or a receiving device (e.g., a second wireless device, UE, or base station) as described herein.

Broadly, FIG. 8 is a diagram illustrating example hardware components of a wireless device in accordance with certain aspects of the disclosure. The illustrated components may include those that may be used for antenna element selection and/or for beamforming for transmission of wireless signals. There are numerous architectures for antenna element selection and implementing phase shifting, only one example of which is illustrated here. The architecture 800 includes a modem (modulator/demodulator) 802, a digital to analog converter (DAC) 804, a first mixer 806, a second mixer 808, and a splitter 810. The architecture 800 also includes a plurality of first amplifiers 812, a plurality of phase shifters 814, and a plurality of second amplifiers 816. Transmission lines or other waveguides, wires, traces, or the like are shown connecting the various components to illustrate how signals to be transmitted may travel between components. Boxes 822, 824, 826, and 828 indicate regions in the architecture 800 in which different types of signals travel or are processed. Specifically, box 822 indicates a region in which digital baseband signals travel or are processed, box 824 indicates a region in which analog baseband signals travel or are processed, box 826 indicates a region in which analog intermediate frequency (IF) signals travel or are processed, and box 828 indicates a region in which analog radio frequency (RF) signals travel or are processed. The architecture 800 also includes a local oscillator A 830, a local oscillator B 832, a local oscillator C 870, and a local oscillator D 872.

Each of the antenna elements 820 may include one or more sub-elements (not shown) for radiating or receiving RF signals. For example, a single antenna element 820 may include a first sub-element cross-polarized with a second sub-element that can be used to independently transmit cross-polarized signals. The antenna elements 820 may include patch antennas or other types of antennas arranged in a linear, two dimensional, or other pattern. A spacing between antenna elements 820 may be such that signals with a desired wavelength transmitted separately by the antenna elements 820 may interact or interfere (e.g., to form a desired beam). For example, given an expected range of wavelengths or frequencies, the spacing may provide a quarter wavelength, half wavelength, or other fraction of a wavelength of spacing between neighboring antenna elements 820 to allow for interaction or interference of signals transmitted by the separate antenna elements 820 within that expected range.

The modem 802 processes and generates digital baseband signals and may also control operation of the DAC 804, first and second mixers 806, 808, splitter 810, first amplifiers 812, phase shifters 814, and/or the second amplifiers 816 to transmit signals via one or more or all of the antenna elements 820. The modem 802 may process signals and control operation in accordance with a communication standard such as a wireless standard discussed herein. The DAC 804 may convert digital baseband signals received from the modem 802 (and that are to be transmitted) into analog baseband signals. The first mixer 806 upconverts analog baseband signals to analog IF signals within an IF using the local oscillator A 830. For example, the first mixer 806 may mix the signals with an oscillating signal generated by the local oscillator A 830 to "move" the baseband analog signals to the IF. In some implementations, some processing or filtering (not shown) may take place at the IF. The second mixer 808 upconverts the analog IF signals to analog RF signals using the local oscillator B 832. Analogously to the first mixer, the second mixer 808 may mix the signals with an oscillating signal generated by the local oscillator B 832 to "move" the IF analog signals to the RF, or the frequency at which signals will be transmitted or received. The modem 802 may adjust the frequency of local oscillator A 830 and/or the local oscillator B 832 so that a desired IF and/or RF frequency is produced and used to facilitate processing and transmission of a signal within a desired bandwidth.

In the illustrated architecture 800, signals upconverted by the second mixer 808 are split or duplicated into multiple signals by the splitter 810. The splitter 810 in architecture 800 splits the RF signal into a plurality of identical or nearly identical RF signals, as denoted by its presence in box 828. In other examples, the split may take place with any type of signal including with baseband digital, baseband analog, or IF analog signals. Each of these signals may correspond to an antenna element 820 and the signal travels through and is processed by amplifiers 812, 816, phase shifters 814, and/or other elements to be provided to and transmitted by the corresponding antenna element 820 as selected for by antenna switching network 818. In one example, the splitter 810 may be an active splitter that is connected to a power supply and provides some gain so that RF signals exiting the splitter 810 are at a power level equal to or greater than the signal entering the splitter 810. In another example, the splitter 810 is a passive splitter that is not connected to power supply and the RF signals exiting the splitter 810 may be at a power level lower than the RF signal entering the splitter 810.

After being split by the splitter 810, the resulting RF signals may enter an amplifier, such as a first amplifier 812, or a phase shifter 814 corresponding to an antenna element 820. The first and second amplifiers 812, 816 are illustrated with dashed lines because one or both of them might not be necessary in some implementations. In one implementation, both the first amplifier 812 and second amplifier 816 are present. In another, neither the first amplifier 812 nor the second amplifier 816 is present. In other implementations, one of the two amplifiers 812, 816 is present but not the other. By way of example, if the splitter 810 is an active splitter, the first amplifier 812 may not be used. By way of further example, if the phase shifter 814 is an active phase shifter that can provide a gain, the second amplifier 816 might not be used. Amplifiers 812 and 816 represent an instantiation of power amplifier 115 and are shown separately from antenna switching network 818 for illustration purposes. The amplifiers 812, 816 may provide a desired level of positive or negative gain. A positive gain (positive dB) may be used to increase an amplitude of a signal for radiation by a specific antenna element 820. A negative gain (negative dB) may be used to decrease an amplitude and/or suppress radiation of the signal by a specific antenna element. Each of the amplifiers 812, 816 may be controlled independently (e.g., by the modem 802) to provide independent control of the gain for each antenna element 820. For example, the modem 802 may have at least one control line connected to each of the splitter 810, first amplifiers 812, phase shifters 814, and/or second amplifiers 816 which may be used to configure a gain to provide a desired amount of gain for each component and thus each antenna element 820.

The phase shifter 814 may provide a configurable phase shift or phase offset to a corresponding RF signal to be transmitted. The phase shifter 814 could be a passive phase shifter not directly connected to a power supply. Passive phase shifters might introduce some insertion loss. The second amplifier 816 could boost the signal to compensate for the insertion loss. The phase shifter 814 could be an active phase shifter connected to a power supply such that the active phase shifter provides some amount of gain or prevents insertion loss. The settings of each of the phase shifters 814 are independent meaning that each can be set to provide a desired amount of phase shift or the same amount of phase shift or some other configuration. The modem 802 may have at least one control line connected to each of the phase shifters 814 and which may be used to configure the phase shifters 814 to provide a desired amounts of phase shift or phase offset between antenna elements 820.

In the illustrated architecture 800, RF signals received by the selected antenna elements 820 are provided to one or more of first amplifier 856 to boost the signal strength. The boosted RF signal is input into one or more of phase shifter 854 to provide a configurable phase shift or phase offset for the corresponding received RF signal. The phase shifter 854 may be an active phase shifter or a passive phase shifter. The settings of the phase shifters 854 are independent, meaning that each can be set to provide a desired amount of phase shift or the same amount of phase shift or some other configuration. The modem 802 may have at least one control line connected to each of the phase shifters 854 and which may be used to configure the phase shifters 854 to provide a desired amount of phase shift or phase offset between antenna elements 820.

The outputs of the phase shifters 854 may be input to one or more second amplifiers 852 for signal amplification of the phase shifted received RF signals. The second amplifiers 852 may be individually configured to provide a configured amount of gain. The second amplifiers 852 may be individually configured to provide an amount of gain to ensure that the signal input to combiner 850 have the same magnitude. The amplifiers 852 and/or 856 are illustrated in dashed lines because they might not be necessary in some implementations. In one implementation, both the amplifier 852 and the amplifier 856 are present. In another, neither the amplifier 852 nor the amplifier 856 are present. In other implementations, one of the amplifiers 852, 856 is present but not the other.

In the illustrated architecture 800, signals output by the phase shifters 854 (via the amplifiers 852 when present) are combined in combiner 850. The combiner 850 in architecture 800 combines the RF signals into a signal, as denoted by its presence in box 828. The combiner 850 may be a passive combiner, e.g., not connected to a power source, which may result in some insertion loss. The combiner 850 may be an active combiner, e.g., connected to a power source, which may result in some signal gain. When combiner 850 is an active combiner, it may provide a different (e.g., configurable) amount of gain for each input signal so that the input signals have the same magnitude when they are combined. When combiner 850 is an active combiner, it may not need the second amplifier 852 because the active combiner may provide the signal amplification.

The output of the combiner 850 is input into mixers 848 and 846. Mixers 848 and 846 generally down convert the received RF signal using inputs from local oscillators 872 and 870, respectively, to create intermediate or baseband signals that carry the encoded and modulated information. The output of the mixers 848 and 846 are input into an analog-to-digital converter (ADC) 844 for conversion to analog signals. The analog signals output from ADC 844 is input to modem 802 for baseband processing, e.g., decoding, de-interleaving, etc.

The modem 802 may function as controller 120 to control antenna switching network 818 to select one or more antenna elements 820 and/or to form beams for transmission of one or more signals. For example, the antenna elements 820 may be individually selected or deselected for transmission of a signal (or signals) by controlling an amplitude of one or more corresponding amplifiers, such as the first amplifiers 812 and/or the second amplifiers 816. Beamforming includes generation of a beam using a plurality of signals on different antenna elements where one or more or all of the plurality signals are shifted in phase relative to each other. The formed beam may carry physical or higher layer reference signals or information. As each signal of the plurality of signals is radiated from a respective antenna element 820, the radiated signals interact, interfere (constructive and destructive interference), and amplify each other to form a resulting beam. The shape (such as the amplitude, width, and/or presence of side lobes) and the direction can be dynamically controlled by modifying the phase shifts or phase offsets imparted by the phase shifters 814 and amplitudes imparted by the amplifiers 812, 816 of the plurality of signals relative to each other.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transformer-based antenna switching network, comprising:
   a first transformer including a primary winding and a secondary winding;
   a first differential power amplifier having a first output connected to a first terminal of the primary winding of the first transformer and having a second output connected to a second terminal of the primary winding of the first transformer;
   a first switch coupled between a first terminal of the secondary winding of the first transformer and ground, wherein the first switch is a first switch transistor;
   a first antenna coupled to the first terminal of the secondary winding of the first transformer;
   a second switch coupled between a second terminal of the secondary winding of the first transformer and ground;
   a second antenna coupled to the second terminal of the secondary winding of the first transformer;
   a first capacitor connected between the first terminal of the primary winding of the first transformer and the second terminal of the primary winding of the first transformer; and
   a second capacitor connected between the first terminal of the secondary winding of the first transformer and the second terminal of the secondary winding of the first transformer.

2. The transformer-based antenna switching network of claim 1, further comprising:
   a controller configured to close the second switch and to open the first switch to select for the first antenna, and wherein the controller is further configured to close the first switch and to open the second switch to select for the second antenna.

3. The transformer-based antenna switching network of claim 1, further comprising a transmitter having a radio-frequency frontend including the first differential power amplifier.

4. The transformer-based antenna switching network of claim 1, wherein the first antenna and the second antenna are included within a phased-array of antennas.

5. The transformer-based antenna switching network of claim 1, wherein the transformer-based antenna switching network is incorporated into a cellular device.

6. The transformer-based antenna switching network of claim 1, further comprising:
   a second transformer including a primary winding and a secondary winding;
   a second differential power amplifier having a first output connected to a first terminal of the primary winding of the second transformer and having a second output connected to a second terminal of the primary winding of the second transformer;
   a third switch coupled between a first terminal of the secondary winding of the second transformer and ground,
   a third antenna coupled to the first terminal of the secondary winding of the second transformer;
   a fourth switch coupled between a second terminal of the secondary winding of the second transformer and ground; and
   a fourth antenna coupled to the second terminal of the secondary winding of the second transformer.

7. The transformer-based antenna switching network of claim 1, wherein the second antenna comprises a dipole antenna having a first terminal coupled to the second terminal of the secondary winding of the first transformer, the transformer-based antenna switching network further comprising:
   a second transformer including a secondary winding;
   a third switch coupled between a first terminal of the secondary winding of the second transformer and ground, wherein the dipole antenna includes a second terminal coupled to the first terminal of the secondary winding of the second transformer;
   a fourth switch coupled between a second terminal of the secondary winding of the second transformer and ground; and
   a third antenna coupled to the second terminal of the secondary winding of the second transformer.

8. The transformer-based antenna switching network of claim 1, wherein the first antenna is a patch antenna and the second antenna is a dipole antenna.

9. The transformer-based antenna switching network of claim 1, wherein an off-capacitance of the first switch transistor, a capacitance of the second capacitor, and an inductance of the secondary winding of the first transformer are combined in a resonant circuit that is resonant at a transmission frequency for the first differential power amplifier.

10. The transformer-based antenna switching network of claim 1, wherein an off-capacitance of the first switch transistor and an inductance of the secondary winding of the first transformer are combined in a resonant circuit that is resonant at a transmission frequency for the first differential power amplifier.

11. The transformer-based antenna switching network of claim 1, further comprising:
    a third switch, wherein the first antenna is coupled to the first terminal of the secondary winding of the first transformer through the third switch; and
    a fourth switch, wherein the second antenna is coupled to the second terminal of the secondary winding of the first transformer through the fourth switch.

12. The transformer-based antenna switching network of claim 1, further comprising:
    a low-noise amplifier having a first input coupled to the first terminal of the secondary winding of the first transformer through a third switch and having a second input coupled to the second terminal of the secondary winding of the first transformer through a fourth switch.

13. The transformer-based antenna switching network of claim 1, further comprising:
    a first low-noise amplifier having an input coupled to the first terminal of the secondary winding of the first transformer through a third switch; and
    a second low-noise amplifier having an input coupled to the second terminal of the secondary winding of the first transformer through a fourth switch.

14. An antenna switching method, comprising
    opening a first switch coupled between a first terminal of a secondary winding of a first transformer and ground;
    while the first switch is opened, closing a second switch coupled between a second terminal of the secondary winding of the first transformer and ground to select for a first antenna coupled to the first terminal of the secondary winding of the first transformer and to isolate a second antenna coupled to the second terminal of the secondary winding of the first transformer;
    closing a third switch coupled between a first terminal of a secondary winding of a second transformer and ground; and
    while the third switch is closed, opening a fourth switch coupled between a second terminal of the secondary winding of the second transformer and ground to select for a third antenna coupled to the second terminal of the secondary winding of the second transformer.

15. The antenna switching method of claim 14, further comprising:
    closing the first switch; and
    while the first switch is closed, opening the second switch to select for the second antenna and to isolate the first antenna.

16. A transformer-based antenna switching network, comprising:
    a first transformer including a first secondary winding;
    a second transformer including a second secondary winding, wherein the second secondary winding includes a first terminal connected to a first terminal of the first secondary winding;
    a third transformer including a third secondary winding;
    a fourth transformer including a fourth secondary winding, wherein the fourth secondary winding includes a first terminal connected to a first terminal of the third secondary winding;
    a first antenna connected to a second terminal of the first secondary winding;
    a first switch coupled between ground and the second terminal of the first secondary winding;
    a second switch coupled between ground and a second terminal of the second secondary winding;
    a third switch coupled between ground and a second terminal of the third secondary winding;
    a fourth switch coupled between ground and a second terminal of the fourth secondary winding; and
    a second antenna connected to the second terminal of the fourth secondary winding.

17. The transformer-based antenna switching network of claim 16, further comprising:
    a dipole antenna having a first input connected to the second terminal of the second secondary winding and having a second input connected to second terminal of the third secondary winding.

18. The transformer-based antenna switching network of claim 16, further comprising:
    a first power amplifier coupled to a primary winding of the first transformer;
    a second power amplifier coupled to a primary winding of the second transformer;
    a third power amplifier coupled to a primary winding of the third transformer; and
    a fourth power amplifier coupled to a primary winding of the fourth transformer.

19. The transformer-based antenna switching network of claim 17, wherein the transformer-based antenna switching network is incorporated into a cellular device.

20. A transformer-based antenna switching network, comprising:
    a transformer including a secondary winding and a primary winding;
    a first switch coupled between a first terminal of the secondary winding of the transformer and ground;
    a second switch coupled between a second terminal of the secondary winding of the transformer and ground;
    a differential power amplifier having a first output connected to a first terminal of the primary winding of the transformer and having a second output connected to a second terminal of the primary winding of the transformer; and
    a low-noise amplifier having a first input terminal coupled to the first terminal of the secondary winding.

21. The transformer-based antenna switching network of claim 20, further comprising:
    a first capacitor coupled in parallel with the primary winding.

22. The transformer-based antenna switching network of claim 21, further comprising:
    a second capacitor coupled in parallel with the secondary winding.

23. The transformer-based antenna switching network of claim 20, wherein the first switch is a first switch transistor, and wherein an off-capacitance of the first switch transistor and an inductance of the secondary winding are combined in a resonant circuit that is resonant at a transmission frequency for the differential power amplifier.

24. The transformer-based antenna switching network of claim 23, wherein the second switch is a second switch transistor, and wherein an off-capacitance of the second switch transistor is substantially equal to the off-capacitance of the first switch transistor.

25. The transformer-based antenna switching network of claim 20, wherein the low-noise amplifier is a differential low-noise amplifier having a second input terminal coupled to the second terminal of the secondary winding.

26. The transformer-based antenna switching network of claim 20, wherein the low-noise amplifier is a first low-noise amplifier, the transformer-based antenna switching network further comprising a second low-noise amplifier having a second input terminal coupled to the second terminal of the secondary winding.

27. A transformer-based antenna switching network, comprising:
    a first transformer including a secondary winding;
    a first switch coupled between a first terminal of the secondary winding of the first transformer and ground;
    a first antenna coupled to the first terminal of the secondary winding of the first transformer;
    a second switch coupled between a second terminal of the secondary winding of the first transformer and ground;

a second antenna coupled to the second terminal of the secondary winding of the first transformer, wherein the second antenna comprises a dipole antenna having a first terminal coupled to the second terminal of the secondary winding of the first transformer;

a second transformer including a secondary winding;

a third switch coupled between a first terminal of the secondary winding of the second transformer and ground, wherein the dipole antenna includes a second terminal coupled to the first terminal of the secondary winding of the second transformer;

a fourth switch coupled between a second terminal of the secondary winding of the second transformer and ground; and a third antenna coupled to the second terminal of the secondary winding of the second transformer.

28. The transformer-based antenna switching network of claim 27, wherein the first antenna is a patch antenna.

29. The transformer-based antenna switching network of claim 27, further comprising a low-noise amplifier having an input terminal coupled to the first terminal of the secondary winding of the first transformer.

30. A transformer-based antenna switching network, comprising:

a first transformer including a secondary winding;

a first switch coupled between a first terminal of the secondary winding of the first transformer and ground;

a first antenna coupled to the first terminal of the secondary winding of the first transformer;

a second switch coupled between a second terminal of the secondary winding of the first transformer and ground;

a second antenna coupled to the second terminal of the secondary winding of the first transformer;

a third switch, wherein the first antenna is coupled to the first terminal of the secondary winding of the first transformer through the third switch; and a fourth switch, wherein the second antenna is coupled to the second terminal of the secondary winding of the first transformer through the fourth switch.

31. The transformer-based antenna switching network of claim 30, wherein the first antenna and the second antenna are included within a phased-array of antennas.

32. The transformer-based antenna switching network of claim 30, further comprising a low-noise amplifier having an input terminal coupled to the first terminal of the secondary winding of the first transformer.

33. A transformer-based antenna switching network, comprising:

a first transformer including a primary winding and secondary winding;

a first differential power amplifier having a first output connected to a first terminal of the primary winding of the first transformer and having a second output connected to a second terminal of the primary winding of the first transformer;

a first switch coupled between a first terminal of the secondary winding of the first transformer and ground;

a first antenna coupled to the first terminal of the secondary winding of the first transformer;

a second switch coupled between a second terminal of the secondary winding of the first transformer and ground;

a second antenna coupled to the second terminal of the secondary winding of the first transformer;

a second transformer including a primary winding and a secondary winding;

a second differential power amplifier having a first output connected to a first terminal of the primary winding of the second transformer and having a second output connected to a second terminal of the primary winding of the second transformer;

a third switch coupled between a first terminal of the secondary winding of the second transformer and ground, a third antenna coupled to the first terminal of the secondary winding of the second transformer;

a fourth switch coupled between a second terminal of the secondary winding of the second transformer and ground; and a fourth antenna coupled to the second terminal of the secondary winding of the second transformer.

34. The transformer-based antenna switching network of claim 33, wherein the first antenna and the second antenna are included within a phased-array of antennas.

35. The transformer-based antenna switching network of claim 33, further comprising a low-noise amplifier having an input terminal coupled to the first terminal of the secondary winding of the first transformer.

\* \* \* \* \*